(12) United States Patent
Kim et al.

(10) Patent No.: US 8,008,662 B2
(45) Date of Patent: Aug. 30, 2011

(54) DISPLAY SUBSTRATE AND METHOD OF MANUFACTURING THE SAME

(75) Inventors: Joo-Han Kim, Yongin-si (KR); Min-Seok Oh, Yongin-si (KR); Jun-Young Lee, Yonin-si (KR); Sung-Wook Kang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/626,587

(22) Filed: Nov. 25, 2009

(65) Prior Publication Data

US 2010/0084658 A1 Apr. 8, 2010

Related U.S. Application Data

(62) Division of application No. 11/647,879, filed on Dec. 29, 2006, now Pat. No. 7,745,342.

(30) Foreign Application Priority Data

Jan. 2, 2006 (KR) .................. 10-2006-0000205

(51) Int. Cl.
*H01L 29/04* (2006.01)
*H01L 29/00* (2006.01)
*H01L 31/00* (2006.01)

(52) U.S. Cl. ..... 257/59; 257/366; 257/72; 257/E21.413; 257/E21.414; 349/114; 349/113; 349/115; 349/138

(58) Field of Classification Search ............. 257/59, 257/366, 72, E21.413, E21.414; 349/113–115, 349/138
See application file for complete search history.

(56) References Cited

U.S. PATENT DOCUMENTS

| 2001/0025959 A1* | 10/2001 | Yamazaki et al. ............... 257/72 |
| 2005/0046762 A1* | 3/2005 | Kim et al. ........................ 349/38 |
| 2006/0186411 A1* | 8/2006 | Kim et al. ........................ 257/59 |
| 2006/0262244 A1* | 11/2006 | Cho et al. ......................... 349/84 |
| 2006/0262263 A1* | 11/2006 | Yang et al. ..................... 349/141 |
| 2007/0139591 A1* | 6/2007 | Kim ................................ 349/114 |
| 2007/0164330 A1* | 7/2007 | Jeong et al. .................... 257/291 |
| 2007/0243650 A1* | 10/2007 | Kim et al. ........................ 438/38 |
| 2008/0002152 A1* | 1/2008 | Collins et al. ................. 351/215 |

FOREIGN PATENT DOCUMENTS

| CN | 1501153 | 12/1999 |
| CN | 1610110 | 4/2005 |
| CN | 1702531 | 11/2005 |

\* cited by examiner

*Primary Examiner* — Zandra Smith
*Assistant Examiner* — Telly D Green
(74) *Attorney, Agent, or Firm* — Innovation Counsel LLP

(57) ABSTRACT

A display substrate having a low-resistance metallic layer and a method of manufacturing the display substrate. The gate conductors are extended in a first direction. The source conductors are extended in a second direction crossing the first direction including a lower layer of molybdenum or a molybdenum alloy, and an upper layer of aluminum or an aluminum alloy. The pixel areas are defined by the gate conductors and the source conductors. A switching element is formed in each of the pixel areas and includes a gate electrode extended from the gate conductor and a source electrode extended from the source conductor. The pixel electrode includes a transparent conductive material, and is electrically connected to a drain electrode of the switching element.

16 Claims, 21 Drawing Sheets

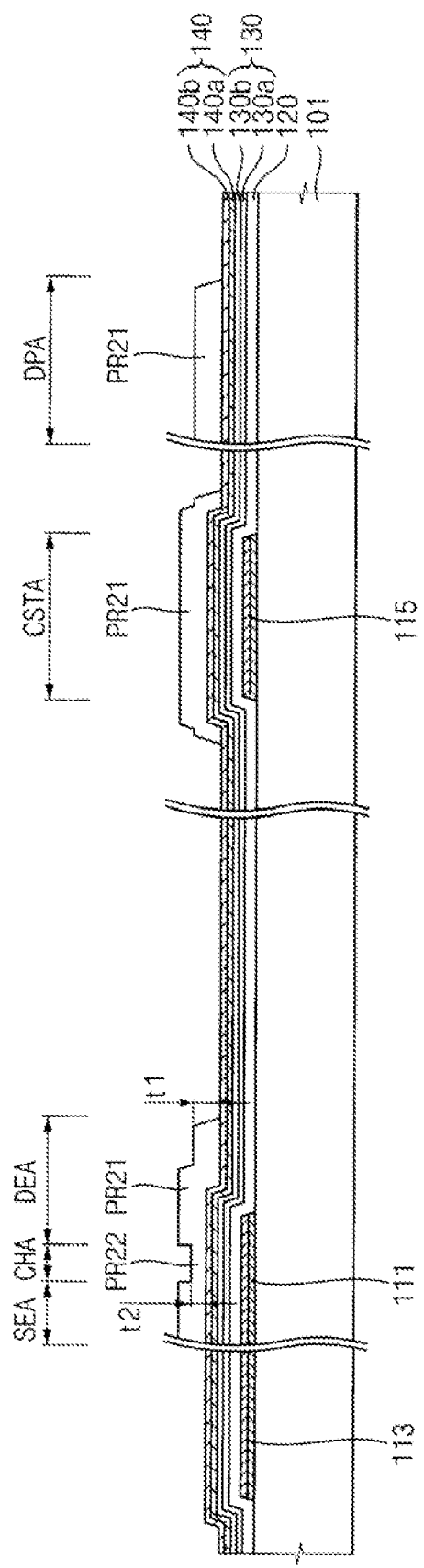

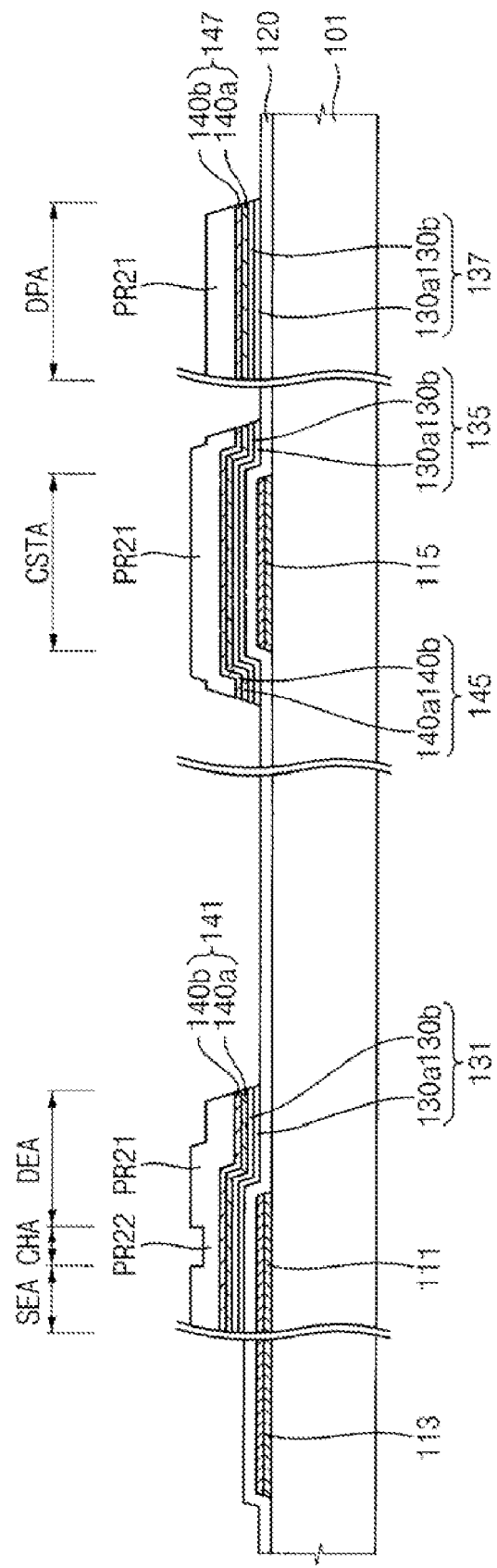

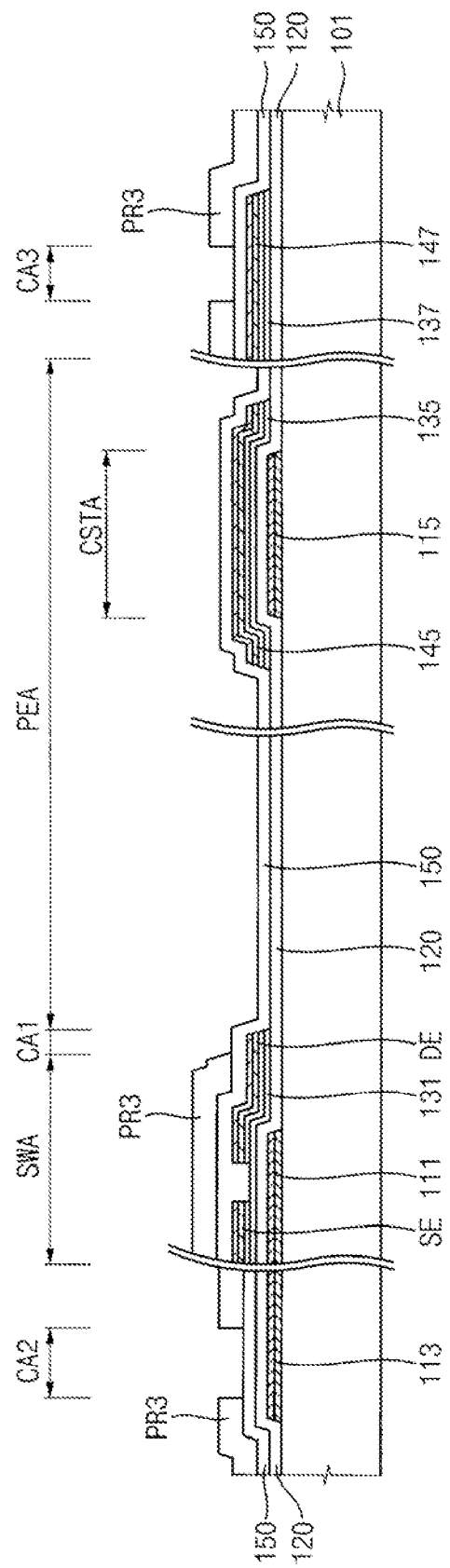

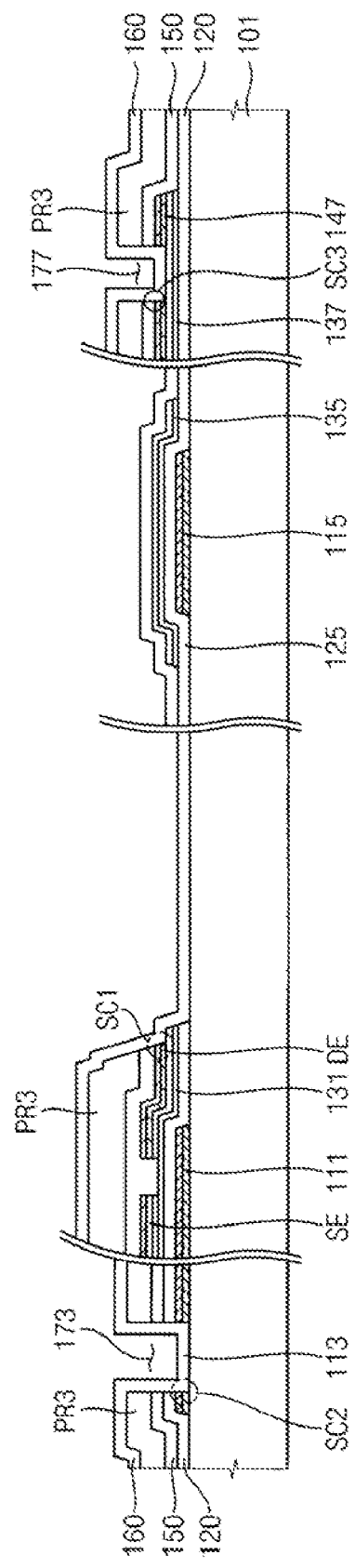

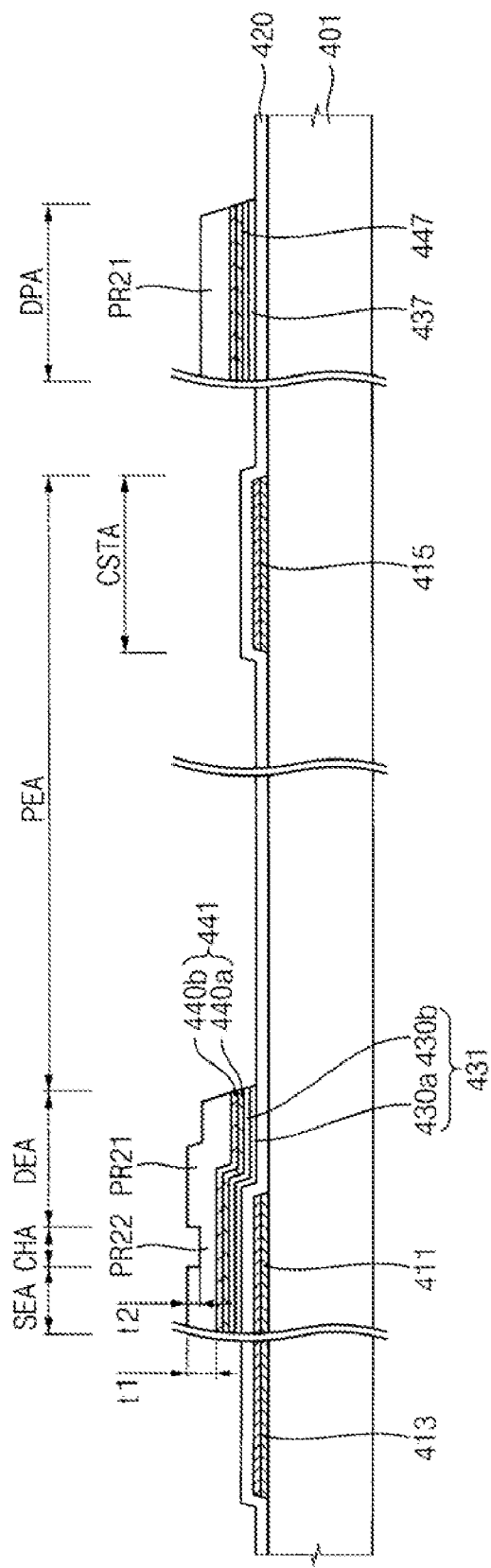

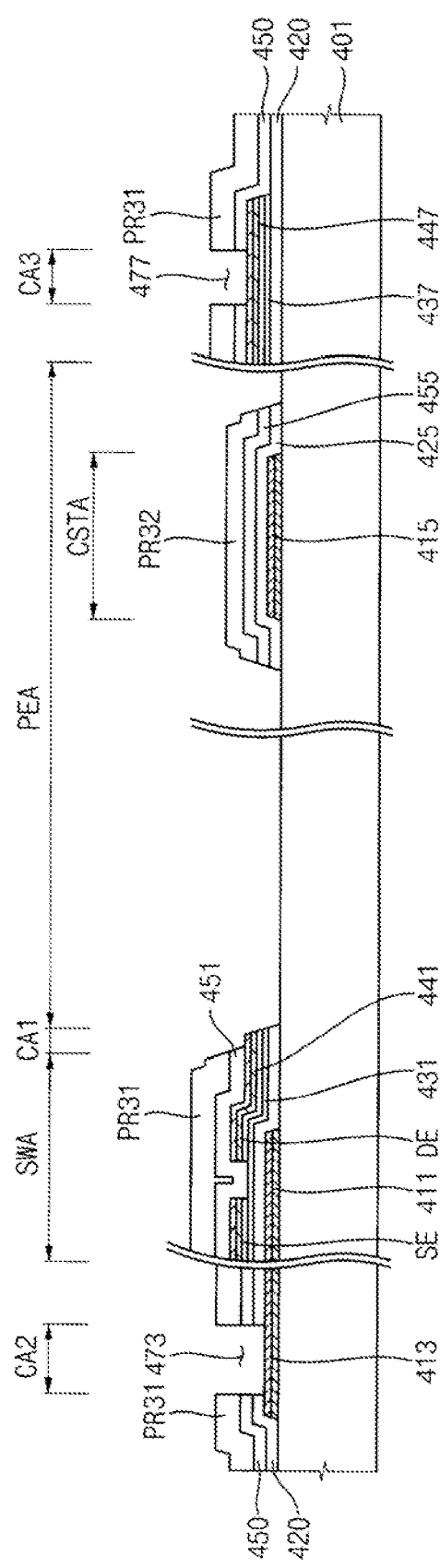

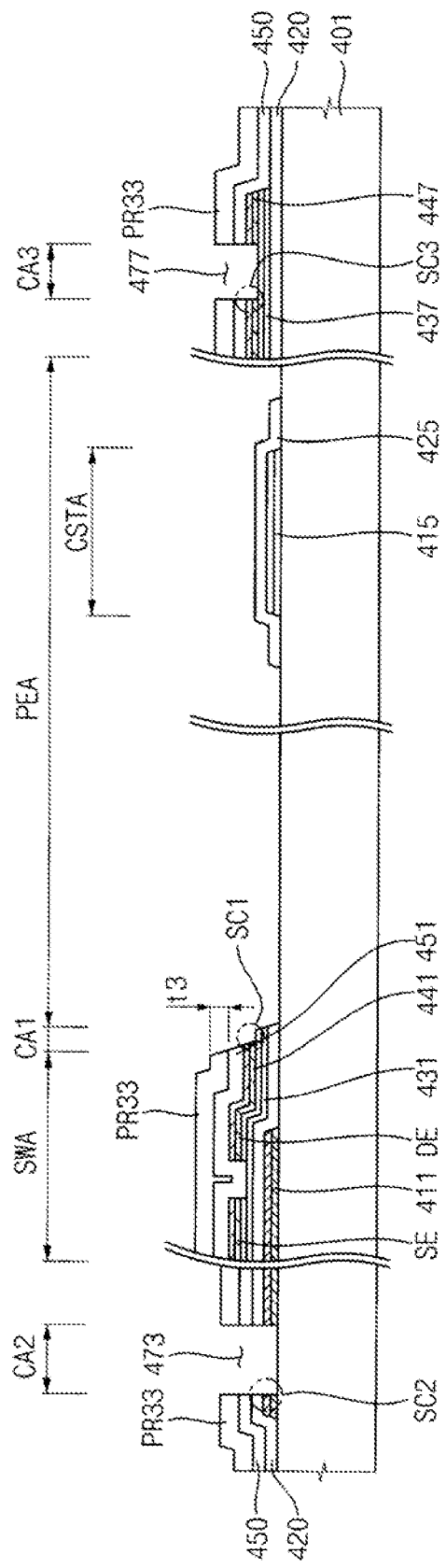

DISPLAY SUBSTRATE AND METHOD OF MANUFACTURING THE SAME

CROSS-REFERENCE TO RELATED APPLICATIONS

This application is a Divisional of U.S. patent application Ser. No. 11/647,879 filed on Dec. 29, 2006 which claims priority of Korean Patent Application No. 2006-0000205 filed on Jan. 2, 2006, the contents of which are herein incorporated by reference.

FIELD OF THE INVENTION

The present invention relates to a display substrate and, more particularly, to a display substrate having low-resistance metallic conductors and a method of manufacturing the same.

DESCRIPTION OF THE RELATED ART

In general, a liquid crystal display (LCD) includes a liquid crystal layer injected into the space between a display substrate and a counter substrate. Gate conductors, source conductors crossing the gate conductors, a switching element electrically connected to each of the gate conductors and each of the source conductors, and a pixel electrode electrically connected to the switching element are formed on the display substrate. The switching element includes a gate electrode extended from each of the gate conductors, a channel insulated from the gate electrode and overlapped by the gate electrode, a source electrode extended from each of the source conductors and electrically connected to the channel, and a drain electrode spaced apart from the source electrode and electrically connected to the channel.

A mask is used for manufacturing the display substrate. In order to reduce manufacturing time and costs, a manufacturing method using a reduced number of masks has been developed. For example, the display substrate is manufactured using five masks, the five masks corresponding to a gate metal patterning process forming the gate conductors, a channel patterning process, a source metal patterning process, a contact hole patterning process, and a pixel electrode patterning process. In order to manufacture the display substrate using four masks, one mask is used in both the channel patterning process and the source metal patterning process. Thus, the number of the masks used is four.

Moreover, when the screen size and resolution of the LCD device are increased, the resistive-capacitive (RC) delay of the metallic conductors formed on the display substrate is increased. In order to minimize the RC delay, aluminum having low resistance is used for the metallic conductors. The aluminum conductors reduce the RC delay, however, the number of defects generated during manufacturing of the LCD device typically increase.

SUMMARY OF THE INVENTION

In accordance with present invention, a method of manufacturing a display substrate comprises forming a gate metallic layer on a base substrate forming a gate the gate metallic layer on a base substrate, forming a first photoresist pattern that defines a gate conductor, the gate electrode of a switching device and a storage common electrode, forming a source metallic layer defining a lower layer of molybdenum (Mo) or a molybdenum alloy and a upper layer of aluminum (Al) or an aluminum alloy on the base substrate having the gate pattern, forming source pattern through patterning the source metallic layer using a second photoresist pattern that defines the source conductors crossing the gate conductors, the switching device and a drain electrode, forming a pixel electrode electrically connected to the drain electrode using a third photoresist pattern.

According to the display substrate and the method of manufacturing the same mentioned above, the metallic conductors have a double-layer structure (Mo/Al) including a lower layer of molybdenum (Mo) or a molybdenum alloy and an upper layer of aluminum (Al) or an aluminum alloy, to prevent deterioration of the conductors.

BRIEF DESCRIPTION OF THE DRAWINGS

The foregoing and other objects, features and advantages of the present invention may become more apparent from a reading of the ensuing description together with the drawing, in which:

FIGS. 4A to 4I are cross-sectional views illustrating a method of manufacturing the array substrate of FIG. 2; and FIGS. 5A to 5H are cross-sectional views illustrating a method of manufacturing the array substrate of FIG. 2 in accordance with another embodiment of the present invention.

DESCRIPTION OF THE EMBODIMENTS

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

Figure 1:
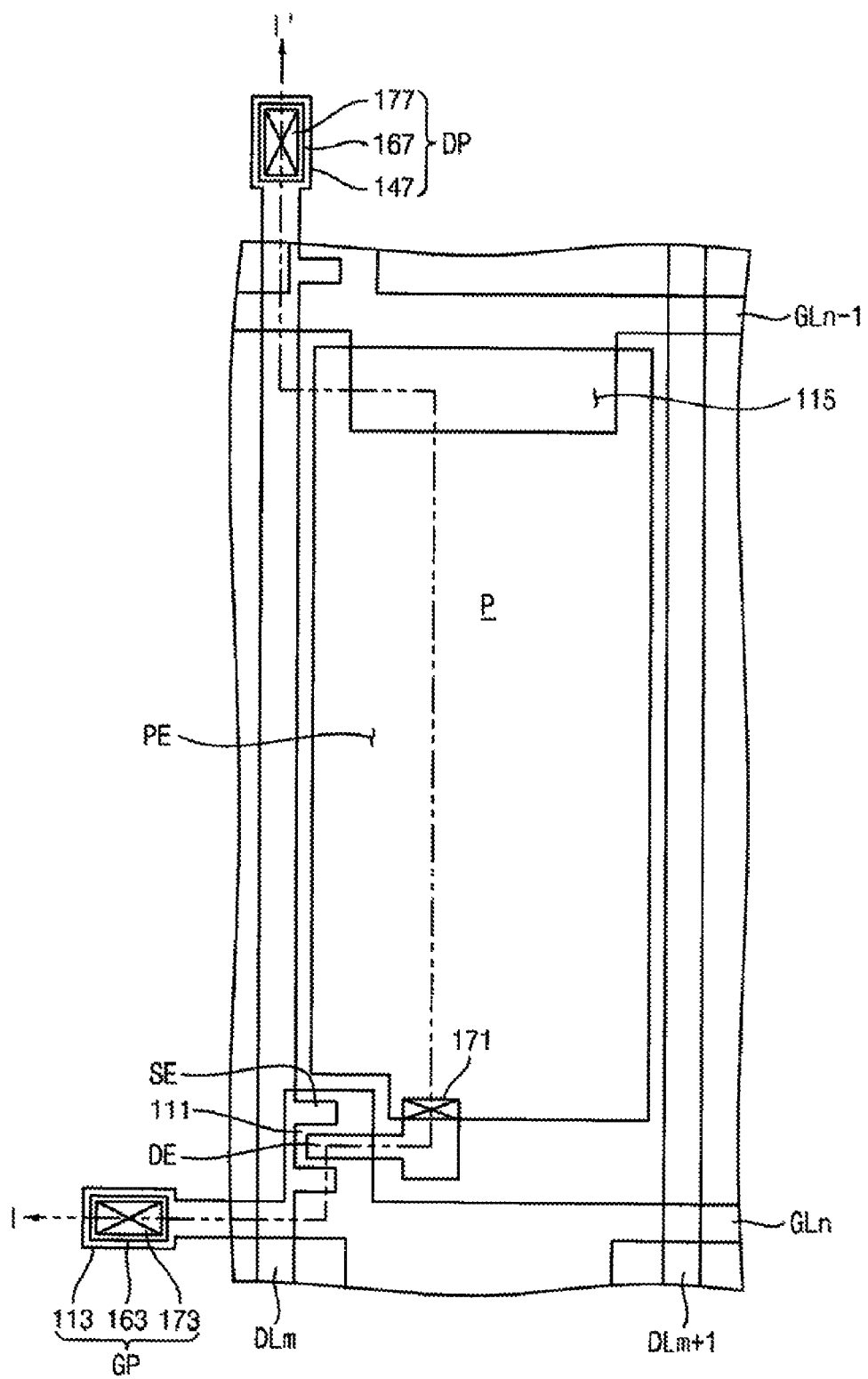
FIG. 1 is a schematic plan view illustrating a display panel in accordance with an embodiment of the present invention.
Figure 2:
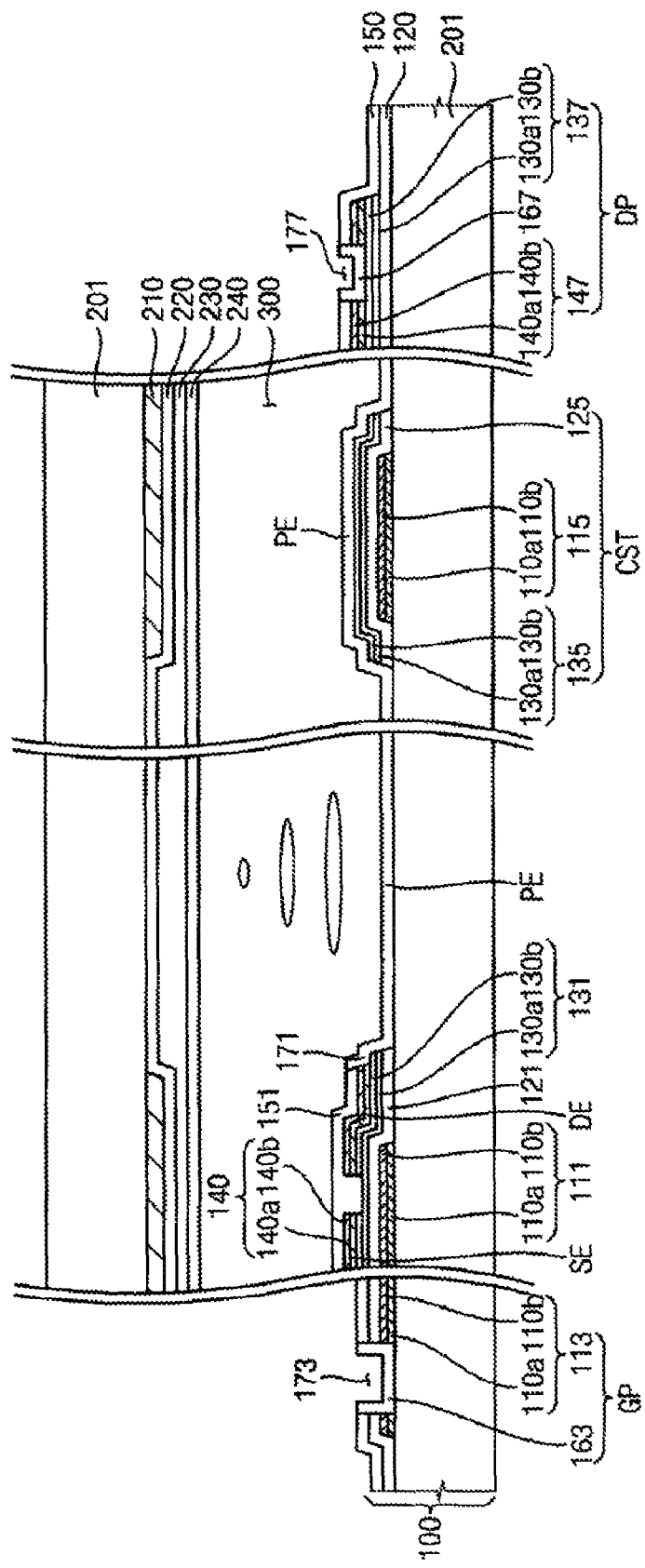
FIG. 2 is a cross-sectional view illustrating the display panel taken along the line I-I' in FIG. 1.

FIG. 1 is a schematic plan view illustrating a display panel in accordance with an embodiment of the present invention. FIG. 2 is a cross-sectional view illustrating the display panel taken along the line I-I' in FIG. 1.

Referring to FIGS. 1 and 2, the display panel includes an array substrate 100, a color filter substrate 200 facing the array substrate 100 and a liquid crystal layer 300 disposed between the array substrate 100 and the color filter substrate 200.

The array substrate 100 includes a first base substrate 101, and a plurality of gate conductors GLn−1 and GLn, a plurality of source conductors DLm and DLm+1, a pixel area P, a switching element TFT, a storage common electrode 115 and a pixel electrode PE that are formed on the first base substrate 101. Gate conductors GLn−1 and GLn extend in a first direction and are formed from a gate metallic layer.

In FIGS. 1 and 2, the gate metallic layer includes a double-layer structure (Mo/Al) having a lower layer 110a and a upper layer 110b. The lower layer 110a includes molybdenum (Mo) or a molybdenum alloy, and the upper layer 110b includes aluminum (Al) or an aluminum alloy.

Gate conductors GLn−1 and GLn include upper layer 110b of aluminum that has low resistance to minimize the resistive-capacitive (RC) delay of the gate conductors and which include lower layer 110a of molybdenum to provide adhesive strength so that the gate conductors are securely attached to substrate 100 with low contact resistance.

A gate pad GP is formed in an end area of each of gate conductors GLn and GLn−1. Gate pad GP includes a gate end pattern 113 extended from gate conductors GLn and GLn−1 and a gate pad pattern 163 electrically connected to gate end pattern 113 through a first contact hole 173. A plurality of first contact holes 173 may be disposed on a plurality of the gate end patterns 113.

Source conductors DLm and DLm+1 extend in a second direction different from the first direction and are formed from a source metallic layer. In FIGS. 1 and 2, the source layer includes a double-layer structure (Mo/Al) having a lower layer 140a and an upper layer 140b. Layer 140a includes molybdenum (Mo) or a molybdenum alloy, and upper layer 140b includes aluminum (Al) or an aluminum alloy.

Source conductors DLm and DLm+1 include upper layer 140b of aluminum that has low resistance to minimize the RC delay of the source conductors and lower layer 140a of molybdenum for adhesive strength and secure attachment to substrate 100 and low contact resistance.

Source pad DP is formed in an end area of each of source conductors DLm and DLm+1. Source pad DP includes a source end area pattern 147 extended from the source conductors and a source pad pattern 167 electrically connected to the source end area pattern 147 through a second contact hole 177. A plurality of the second contact holes 177 may be formed on a plurality of the source end area patterns 147.

Pixel area P is formed in a region defined by gate conductors GLn−1 and GLn and the source conductors DLm and DLm+1. Pixel area P includes the switching element TFT, the storage common electrode 115 and pixel electrode PE. For example, a plurality of pixel areas P may correspond to a plurality of pixel electrodes PE, respectively.

The switching element TFT includes a gate electrode 111 extended from each of gate conductors GLn and GLn−1, a source electrode SE extended from each of the source conductors DLm and DLm+1, and a drain electrode DE electrically connected to pixel electrode PE through a contact part 171. The switching element TFT may further include a channel part 131. The channel part 131 is overlapped with the gate electrode 111, and is electrically connected to the source electrode SE and drain electrode DE. The channel part 131 includes an active layer 130a having amorphous silicon (a-Si) and an ohmic contact layer 130b implanted by N-type impurities at high concentration (n+ a-Si).

A storage common electrode 115 is formed under pixel electrode PE and electrically connected to each of gate conductors GLn−1 and GLn. Electrode 115 is formed from the gate metallic layers 110a and 110b and functions as the first electrode of storage capacitor CST in pixel area P. Pixel electrode PE functions as the second electrode. An patterned gate insulating layer 125 between the first and second electrodes functions as the dielectric. In addition, a patterned active layer 130a and ohmic contact layer 130b are formed on layer 125.

When gate conductor GLn−1 receives a gate-off voltage, the storage common electrode 115 receives a gate-off voltage as a common voltage. Thereby, storage capacitor CST is driven as a part of the front-end gate process to maintain a pixel voltage of pixel electrode PE. Alternatively, a common voltage may be applied to a storage capacitor line (not shown) to maintain the voltage of pixel electrode PE.

Pixel electrode PE includes a transparent conductive layer. Pixel electrode PE is electrically connected to drain electrode DE through the contact part 171 formed under drain electrode DE. The transparent conductive layer may include oxidized material. Examples of the material that can be oxidized to form the transparent conductive layer include indium (In), tin (Sn), zinc (Zn), aluminum (Al), gallium (Ga), etc. These can be used alone or in a mixture thereof.

The color filter substrate 200 includes a base substrate 201, and a light blocking pattern 210, a color filter layer 220, an overcoating layer 230 and a common electrode layer 240 that are formed on the base substrate 201. A light blocking pattern 210 defines an inner space corresponding to the pixel area P prevent light leakage.

Color filter layer 220 includes a plurality of color filter patterns. Each color filter pattern is disposed in a region defined by the light blocking pattern 210. Color filter pattern 210 may include red, green and blue color filters to show a color in response to incident light. Overcoating layer 230 is disposed on the color filter layer 220 to planarize substrate 201 and protect color filter layer 220.

Common electrode 240 is disposed on layer 230. A common voltage is applied to common electrode 240 facing pixel electrode PE so that pixel electrode PE functions as a first electrode of a liquid crystal capacitor CLC while the common electrode layer functions as the second electrode. Liquid crystal layer 300 functions as the dielectric material of the liquid crystal capacitor CLC.

Liquid crystal layer 300 is disposed between substrate 100 and color filter substrate 200. The alignment angle of liquid crystals in the liquid crystal layer 300 is changed in response to the intensity of the voltage applied between the common electrode layer 240 of the color filter substrate 200 and pixel electrode PE. An image is displayed by a change of the alignment angle of the liquid crystals in the liquid crystal layer.

Figure 3A:
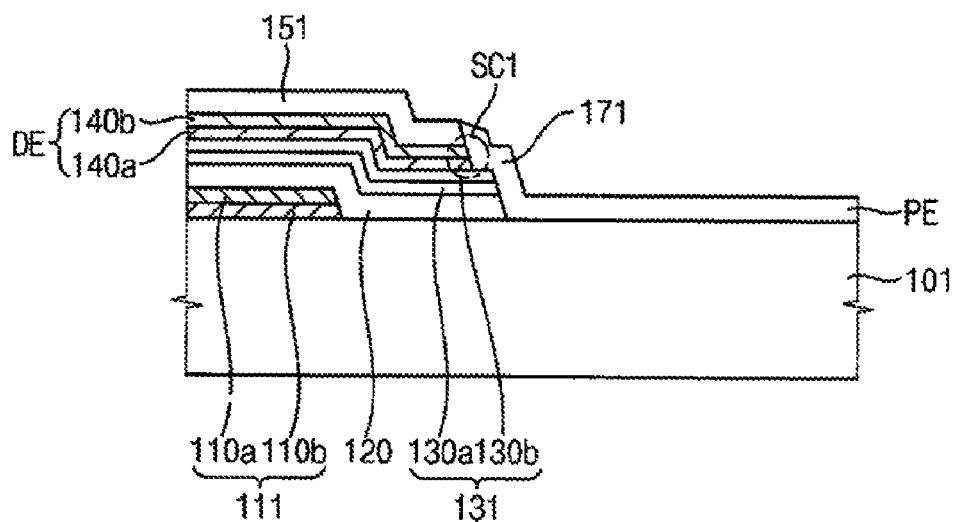
FIG. 3A is an enlarged cross-sectional view illustrating a contact part of FIG. 2.

Referring to FIGS. 1 and 3A, contact 171, disposed on a side area SC1 of drain electrode DE, electrically connects the side area SC1 to pixel electrode PE. Drain electrode DE is formed on the source metallic layer including lower layer 130a of molybdenum (Mo) or a molybdenum alloy and upper layer 130b of aluminum (Al) or an aluminum alloy.

Pixel electrode PE makes contact with lower layer 130a of molybdenum that has excellent adhesive strength with other layers, such as a gate insulating layer 120 thereby improving the contact characteristics of contact 171. Moreover, upper layer 130b of aluminum decreases the resistance of the source metallic layer.

Figure 3B:
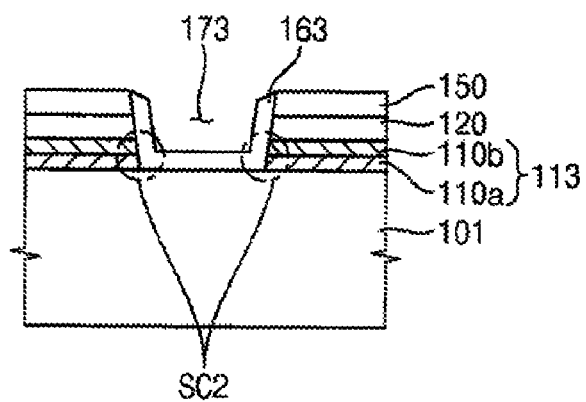
FIG. 3B is an enlarged cross-sectional view illustrating a gate pad of FIG. 2.

FIG. 3B is an enlarged view illustrating the gate pad of FIG. 2. Referring to FIGS. 1 and 3B, gate pad GP is formed in the first end area of the gate conductor GLn to make contact with a terminal of an external apparatus that generates a gate signal. Gate pad GP includes the gate end pattern 113 having a contact hole 173, gate insulating layer 120, and protective insulating layer 150. Gate pad pattern 163 is electrically connected to side area SC2 of gate end pattern 113 through the first contact hole 173.

Gate end pattern 113 is extended from gate conductor GLn, and includes lower layer 110a of molybdenum or a molybdenum alloy and upper layer 110b of aluminum or an aluminum alloy. Gate pad pattern 163 includes substantially the same material as pixel electrode PE.

Lower layer 110a of side area SC2 is electrically connected to gate pad pattern 163. Therefore, gate end pattern 113 is electrically connected to gate pad pattern 163. For example, a plurality of first contact holes 173 is formed so that a plurality of side areas SC2 are electrically connected to gate pad pattern 163. The electrical contact area between gate end pattern 113 and the gate pad pattern 163 is thereby increased, further reducing contact resistance.

Upper layer 110b of gate end pattern 113 is partially removed through the first contact hole 173 thereby preventing the formation of a hillock of aluminum in upper layer 110b.

Figure 3C:
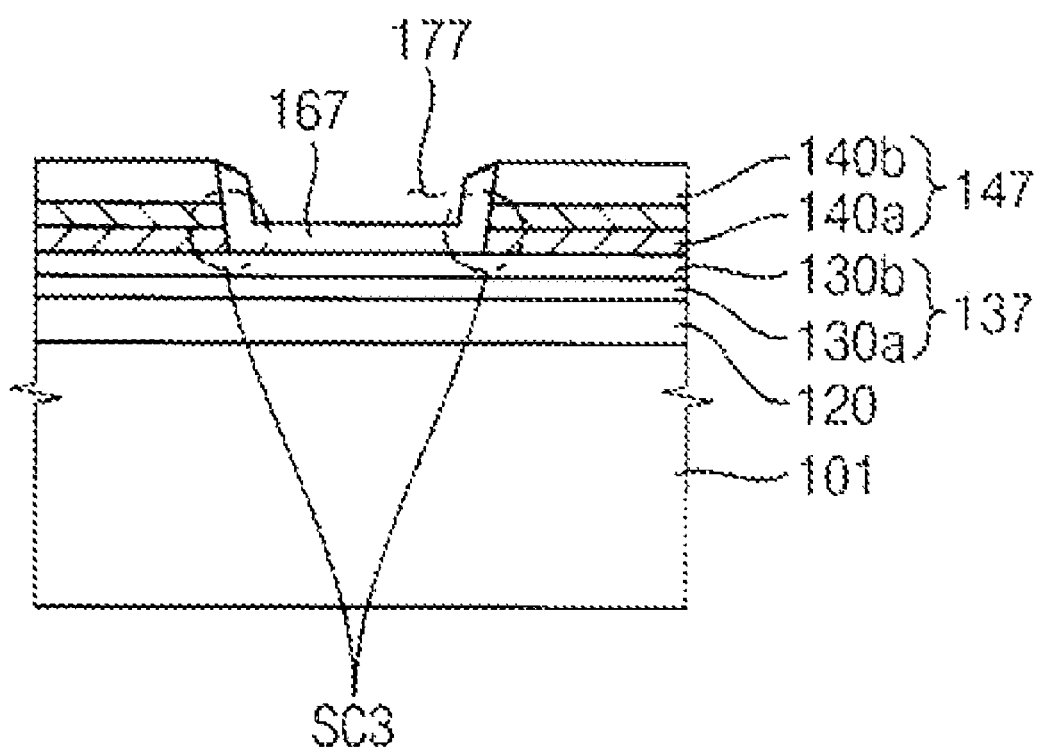
FIG. 3C is an enlarged cross-sectional view illustrating a source pad of FIG. 2.

FIG. 3C is an enlarged view illustrating the source pad of FIG. 2. Referring to FIGS. 1 and 3C, source pad DP is formed in the first end area of the source conductor DLn to make contact with a terminal of an external apparatus that generates a gate signal. Source pad DP includes the source end area pattern 147 having contact hole 177, the protective insulating layer 150. Source pad pattern 167 is electrically connected to side area SC3 of the source end area pattern 147 through contact hole 177.

Source end area pattern 147 is extended from source conductor DLm and includes lower layer 140a of molybdenum (Mo) or a molybdenum alloy and the upper layer 140b of aluminum (Al) or an aluminum alloy. The source pad DP is of substantially the same material as pixel electrode PE.

Lower layer 140a of the third side area SC3 is electrically connected to the source pad pattern 167 so that source end area pattern 147 is electrically connected to source pad pattern 167. For example, a plurality of contact holes is formed, so that a plurality of the third side areas SC3 electrically connected to the source pattern 167 is formed. Therefore, the electrical contact area between the gate end pattern 113 and the gate pad pattern 163 is increased.

Moreover, upper layer 130b of the source end area pattern 147 is partially removed through contact hole 177. Therefore, a hillock of aluminum in the upper layer 130b may be prevented from being formed, and contact resistance caused by aluminum corrosion may also be prevented.

FIGS. 4A to 4I are cross-sectional views illustrating a method of manufacturing the array substrate of FIG. 2.

Figure 4A:
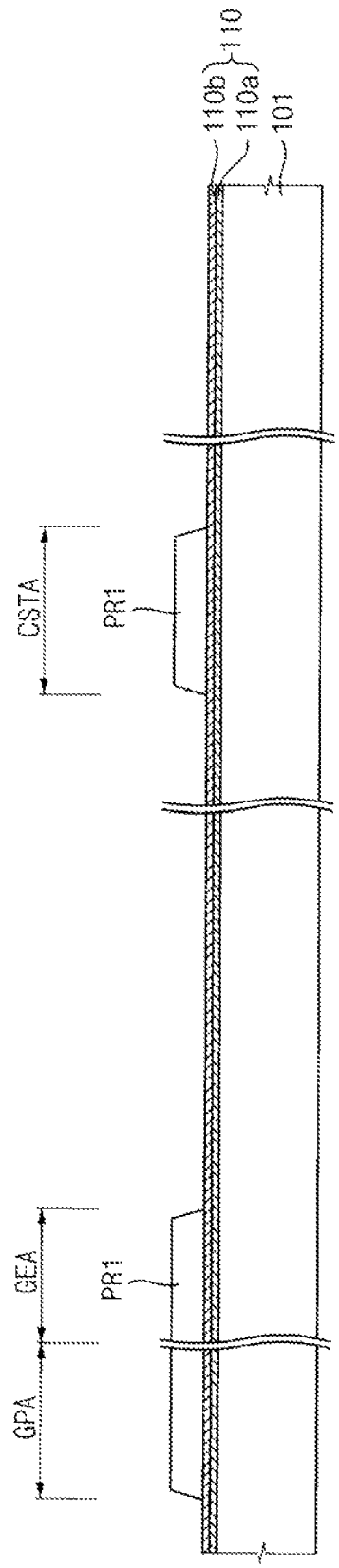

Referring to FIGS. 1 and 4A, a gate metallic layer 110 is formed by stacking a lower layer 110a of molybdenum (Mo) or a molybdenum alloy, and a upper layer 110b of aluminum (Al) or an aluminum alloy. The lower layer 110a is formed to a thickness between about 500 Å and about 1,500 Å to permit easy contact with the gate pad pattern 163 to be formed later. The lower layer 110a may include titanium (Ti) to prevent a stress hillock from being formed in the upper layer 110b having the aluminum. A stress hillock is formed by stress between the upper layer 110b of aluminum and the lower layer 110a of molybdenum.

A first photoresist film is formed on substrate 101 having the gate metallic layer 110, and a photoresist pattern PR1 is formed by patterning the first photoresist film.

Photoresist pattern PR1 defines a gate conductor area, a gate pad area GPA having a gate pad GP, a gate electrode area GEA having a gate electrode 111 for switching device TFT, and a storage area CSTA having a storage common electrode 115 for storage capacitor CST.

Referring to FIGS. 1 and 4B, the gate metallic layer 110 is patterned using the first photoresist pattern PR1, and a gate pattern defining a plurality of gate conductors GLn−1 and GLn, a gate end area 113, a gate electrode GE and a storage common electrode 115.

Gate insulating layer 120 is formed on substrate 101 having the gate pattern. Gate insulating layer 120 is formed at a low temperature between about 100° C. and about 150° C. to prevent a hillock from being formed in the aluminum of the gate pattern. In addition, the gate insulating layer 120 may have a double-layer structure including a lower insulating layer and an upper insulating layer. The lower insulating layer facing the upper layer 110b of aluminum is formed at a low temperature to prevent the hillock from being formed in the aluminum. The upper insulating layer is formed at a normal manufacturing temperature that is higher than the low temperature.

Active layer 130a of amorphous silicon (a-Si) and ohmic contact layer 130b implanted with N-type impurities at high concentration (n+ a-Si) are formed on gate insulator 120, in sequence. Lower layer 140a of molybdenum (Mo) or a molybdenum alloy and upper layer 140b of aluminum (Al) or an aluminum alloy are formed on ohmic contact layer 130b, in sequence, so that the source metallic layer 140 is formed. Lower layer 140a is formed to a thickness between about 500 Å and 1,500 Å to permit easy contact with pixel electrode PE and the source pad pattern 167 to be formed later. Lower layer 140a may include titanium (Ti) to prevent the hillock from being formed in aluminum because of stress between the aluminum and the molybdenum.

A second photoresist film is formed on the source metallic layer 130. The second photoresist film is patterned to form photoresist patterns PR21 and PR22. Photoresist patterns PR21 and PR22 are formed to define a source electrode area SEA having the source electrode SE, a channel area CHA partially exposing the active layer 131a, a drain electrode area DEA having drain electrode DE, a storage capacitor area CSTA having the storage capacitor, and a source pad area DPA having the source pad DP. Moreover, the second photoresist patterns PR21 and PR22 are formed to define a source conductor area (not shown) having the source conductors DLm and DLm+1.

The first photoresist pattern PR21 is formed to a first thickness T1 in the source electrode SEA, the drain electrode area DEA, the storage capacitor area CSTA, the source pad area DPA and the source conductor area. The second photoresist pattern PR22 is formed to a second thickness T2 on the channel area CHA. For example, when the second photoresist film includes a positive photoresist, the second pattern PR22 is patterned through a slit mask or a half-tone mask, and formed to the second thickness. The second thickness is smaller than the first thickness T1.

Referring to FIGS. 1 and 4C, the source metallic layer 140 and the channel layer 130 are partially etched using the first and second photoresist patterns PR21 and PR22 to form the source pattern. The source pattern includes first source patterns 131 and 141, second source patterns 135 and 145 and third source patterns 137 and 147. The first source patterns 131 and 141 are formed in the source electrode area SEA, the drain electrode area DEA and the channel area CHA. The second source patterns 135 and 145 are formed in the storage capacitor area CSTA. The third source patterns 137 and 147 are formed in the source pad area DPA. The third source patterns 137 and 147 include a source pattern area formed in the source conductor area.

The photoresist patterns PR21, PR22 are etched back (partially removed) to a predetermined thickness through an etch-back process. The removed thickness is no less than the first thickness T1 and no more than the second thickness T2.

Figure 4D:
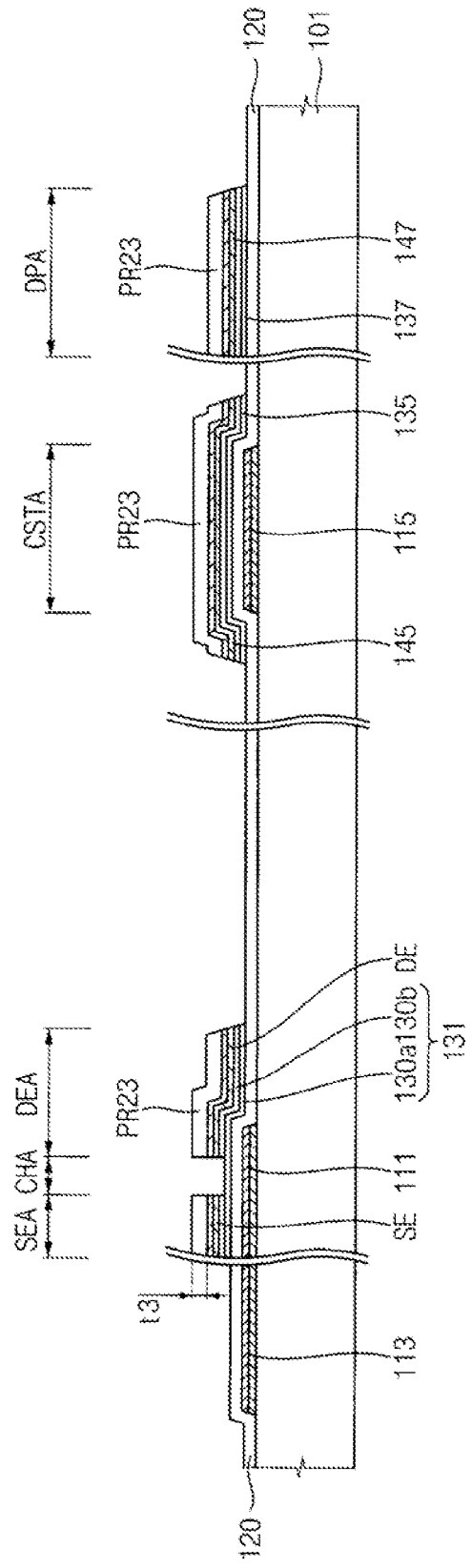

Referring to FIGS. 1 and 4D, the second pattern PR22 formed in the channel area CHA is removed through an etch-back process. A third pattern PR23 is formed to a third thickness T3 in the source electrode area SEA, drain electrode DEA, the storage capacitor area CSTA and the source pad area DPA.

Source electrode SE and drain electrode DE are formed through patterning the first source patterns 131 and 141 using the third pattern PR23. Ohmic contact layer 130b of the channel area CHA is removed, and the active layer 130a is exposed by the source and drain electrode SE and DE. Thereby, the source electrode SE, drain electrode DE and the channel part 131 of the switching element TFT are formed.

Referring to FIGS. 1 and 4E, a protective insulating layer 150 is formed on substrate 101 exposing the active layer 130a of the channel area CHA.

A third photoresist film is formed on the first base substrate 101 having the protective insulating layer 150. The third photoresist film is then patterned to define the photoresist pattern PR3.

The third photoresist pattern PR3 is formed in a switching element area SWA having the switching element TFT and in the areas excluding the pixel electrode area PEA, the contact part area CA1, a first contact hole area CA2 and a second contact hole area CA3. The third photoresist pattern PR3 is formed in the switching element area SWA, a conductor area (not shown) having the source conductors DLm and DLm+1 and gate conductors GLn-1 and GLn.

Figure 4F:
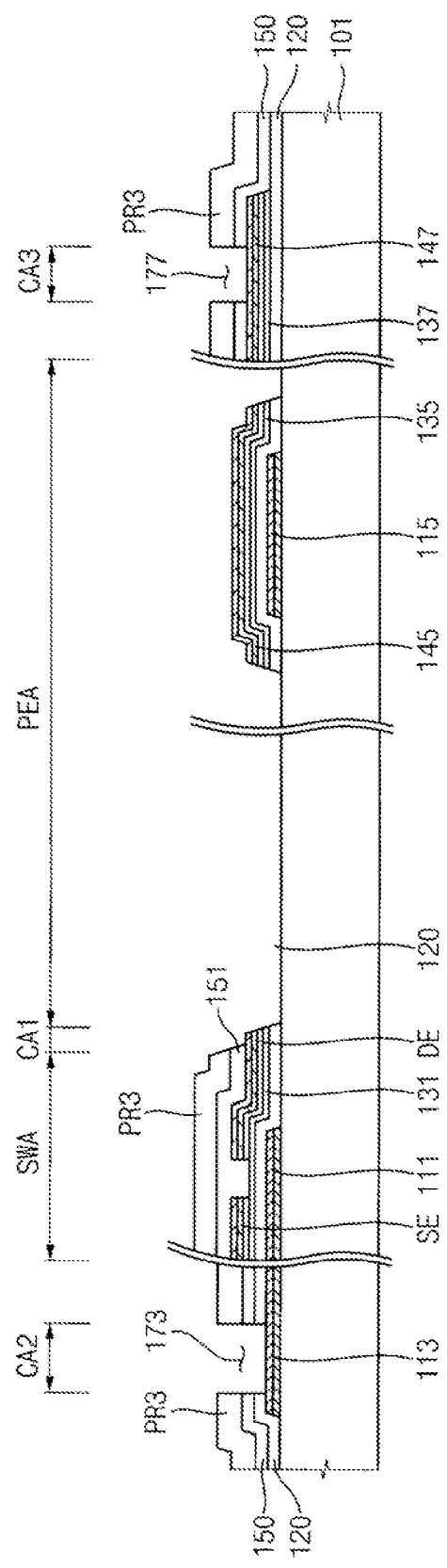

Referring to FIGS. 1 and 4F, gate insulating layer 120 and protective insulating layer 150 of the pixel electrode area PEA, the contact part area CA1, the first contact hole area CA2 and the second contact hole area CA3 are removed through a first etching process using the third photoresist pattern PR3. A dry etching process may be preferable in the first etching process.

Thus, the first end area of drain electrode DE on the contact part area CA1 is exposed. The first contact hole 173 is formed in the first contact hole area CA2, and the second contact hole 177 is formed in the second contact hole area CA3. The first and the second contact holes 173 and 177 may be a plurality.

Gate insulator 120 and/or protective insulating layer 150 remain on switching element TFT, gate conductors GLn-1 and GLn and source conductors DLm and DLm+1.

Figure 4G:
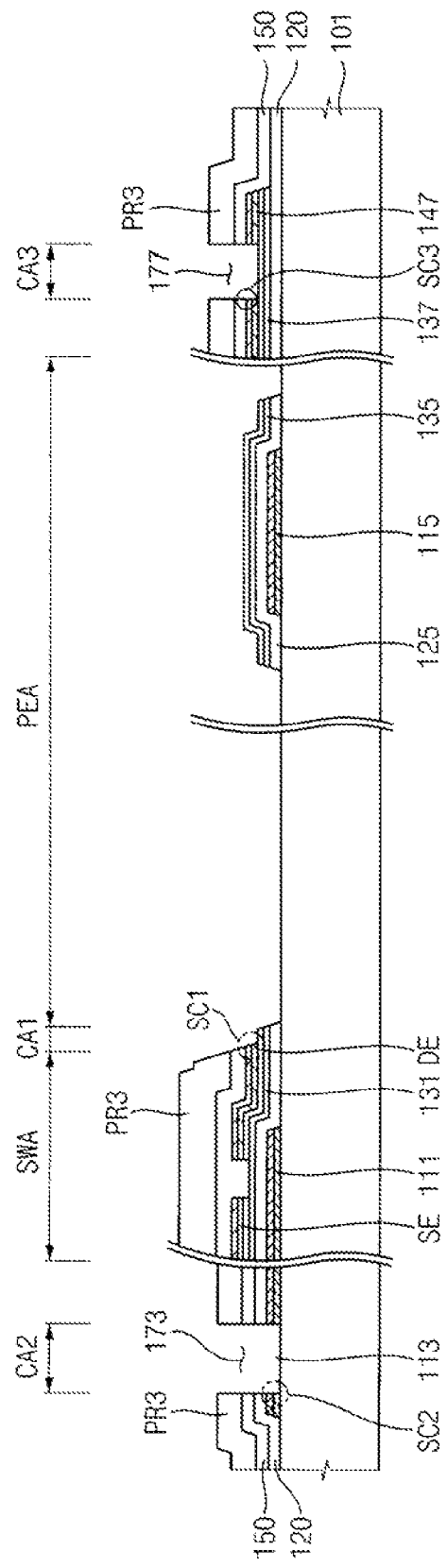

Referring to FIGS. 1 and 4G, the first end area of drain electrode DE exposed on the contact part area CA1, the gate end area 113 exposed on the first contact hole area CA1, the second source pattern 145 exposed on the source storage capacitor area CSTA, and the source end area pattern 147 exposed on the second contact hole area CA2 are etched using the third photoresist pattern PR3. Thereby, a side area SC1 is formed on the end area of drain electrode DE, and a second side area SC2 is formed on the gate end area pattern, and a third side area SC3 is formed on the source end area pattern 147.

A dry etching process may be preferable in the second etching process. The mixture of chloride gas and fluoride gas is used to prevent the aluminum of the upper layer of the first, the second and the third side areas SC1, SC2 and SC3 from corrosion in the second etching process. The fluoride ions substitute for the chloride ions on the surfaces of the first, the second and the third side areas SC1, SC2 and SC3, so that the corrosion caused by the residual chloride ions may be prevented.

As another method to prevent corrosion, after a first etching of aluminum with chloride gas, molybdenum in the lower layer may be etched through the second etching with fluoride gas. Thereby, the residual chloride ions on the first base substrate 101 may be removed by the fluoride gas.

Referring to FIGS. 1 and 4H, a transparent conductive layer 160 is formed on the first base substrate 101 having the first, the second and the third side areas SC1, SC2 and SC3. The transparent conductive layer 160 includes transparent conductive material, and the transparent conductive material includes the oxidized material having indium (In), tin (Sn), zinc (Zn), aluminum (Al) and gallium (Ga), and these can be used alone or in a mixture thereof.

The transparent conductive layer 160 is electrically connected to the first side area CS1 of drain electrode DE, the second side area SC2 of the gate end area pattern 113, and the third side area SC3 of the source end area pattern 147.

The third photoresist pattern PR3 is then removed through a stripping process.

Figure 4I:
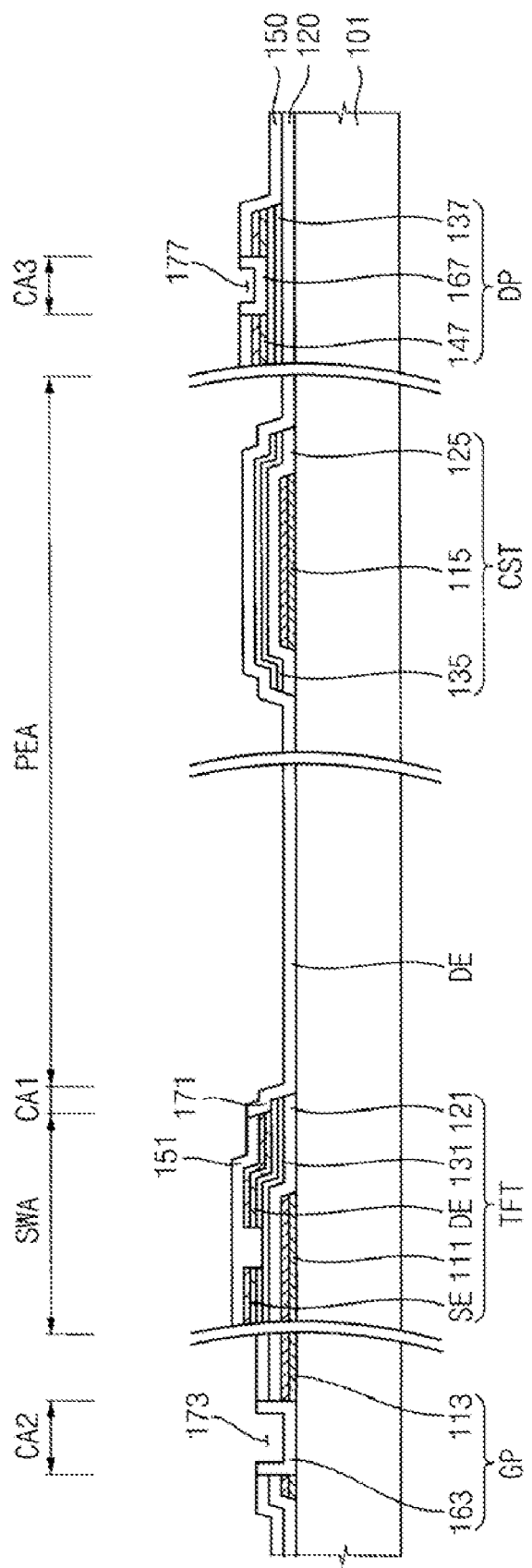

Referring to FIGS. 1 and 4I, transparent conductive layer 160 in the switching element area SWA having the third photoresist pattern PR3 is removed substantially simultaneously with the removal of third photoresist pattern PR3. The transparent conductive layer 160, which is formed using the photoresist pattern PR3 on the source conductors DLm and DLm+1 and gate conductors GLn-1 and GLn, is removed at substantially the same time as the removal of third photoresist pattern PR3.

The transparent conductive layer 160 is patterned through the stripping process of the third photoresist pattern. Thereby, pixel electrode PE, the gate pad pattern 163 and the source pad pattern 167 are formed.

Particularly, drain electrode DE is electrically connected to pixel electrode PE through the contact part 171 connecting the first side area SC1 of drain electrode DE to pixel electrode PE. Gate pad GP is formed on the gate pad pattern 163 electrically connected to the second side area SC2 of the gate end area pattern 113 through the first contact hole 173. Source pad DP is formed on the source pad pattern 167 electrically connected to the third side area SC3 of the source end area pattern 147 through the second contact hole 177.

Storage capacitor CST is defined by pixel electrode PE and the storage common electrode 115.

Therefore, each of the gate metallic layer and the source metallic layer has a double-layer structure including the lower layer of molybdenum (Mo) or a molybdenum alloy and the upper layer 140b of aluminum (Al) or an aluminum alloy. Thus, electrical connection is improved, low resistance is maintained, and contact deterioration by the aluminum corrosion is prevented.

Particularly, the electric connection may be improved between the source electrode and the drain electrode SE, DE having a source metallic layer and the ohmic contact layer 130b formed under the source electrode and the drain electrode SE, DE. Thereby, the characteristic deterioration of the switching element TFT is prevented.

Moreover, the upper layer of aluminum and the lower layer of molybdenum are removed simultaneously through the first and the second contact holes 173 and 177 of the gate end area pattern 113, and the source end area pattern 147 in gate pad GP and the source pad DP. Thereby the contact deterioration by aluminum corrosion is prevented.

FIGS. 5A to 5H are cross-sectional views illustrating a method of manufacturing the array substrate shown in FIG. 2 in accordance with another embodiment of the present invention.

Figure 5A:
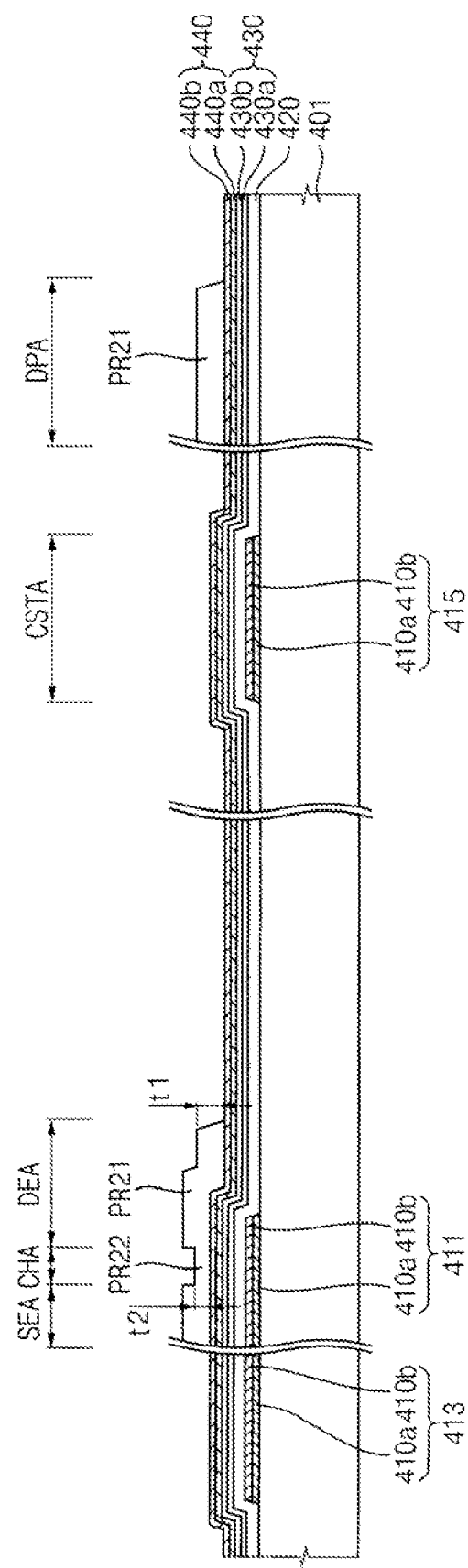

Referring to FIGS. 1 and 5A, a first base substrate 401, gate patterns 411, 413 and 415, a gate insulating layer 420, a channel layer 430, and a source metallic layer 440 are formed in substantially the same process as mentioned above in FIG. 4A.

Photoresist patterns PR21 and PR22 are formed on the first base substrate 401 having the source metallic layer 440. The second photoresist pattern includes the first pattern PR21 formed to the first thickness T1 in a source electrode area SEA, a drain electrode area DEA and a source pad area DPA, and the second pattern PR22 formed to the second thickness T2 in a channel area CHA.

In contrast to the second photoresist pattern according to the embodiment in FIG. 4B, which is formed in a storage capacitor area CSTA, the second photoresist pattern according to the present embodiment in FIG. 5A is not formed in the storage capacitor area CSTA.

Referring to FIGS. 1 and 5B, the source pattern is formed in the etching process of the source metallic layer 440 and the channel layer 430 using the second photoresist patterns PR21 and PR22. The source pattern includes first source patterns 431 and 441 formed in the source electrode area, the channel area and the drain electrode area SEA, CHA and DEA and second source patterns 437 and 447 formed in a source pad area DPA. The second source patterns 437 and 447 include the source conductors.

The second photoresist patterns PR21 and PR22 are etched by a predetermined thickness through an etch-back process.

Figure 5C:
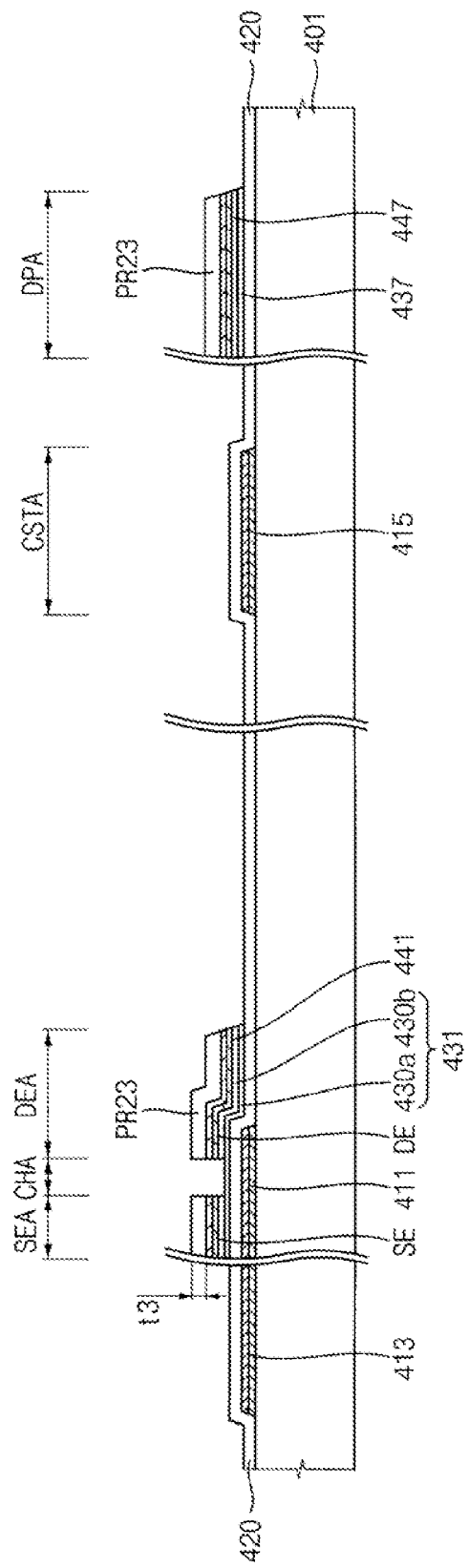

Referring to FIGS. 1 and 5C, the second pattern PR22 formed in the channel area CHA is removed by the etch-back process, and a third pattern PR23 remains at the third thickness T3 in the source electrode area SEA, the drain electrode area DEA and the source pad area DPA.

The source electrode SE and drain electrode DE are formed through patterning the first source patterns 431 and 441 using the third pattern PR23. An active layer 430a is exposed through removing an ohmic contact layer 430b in the channel area CHA. Thereby the source electrode SE, drain electrode DE and the channel part 431 in the switching element TFT are formed.

Figure 5D:
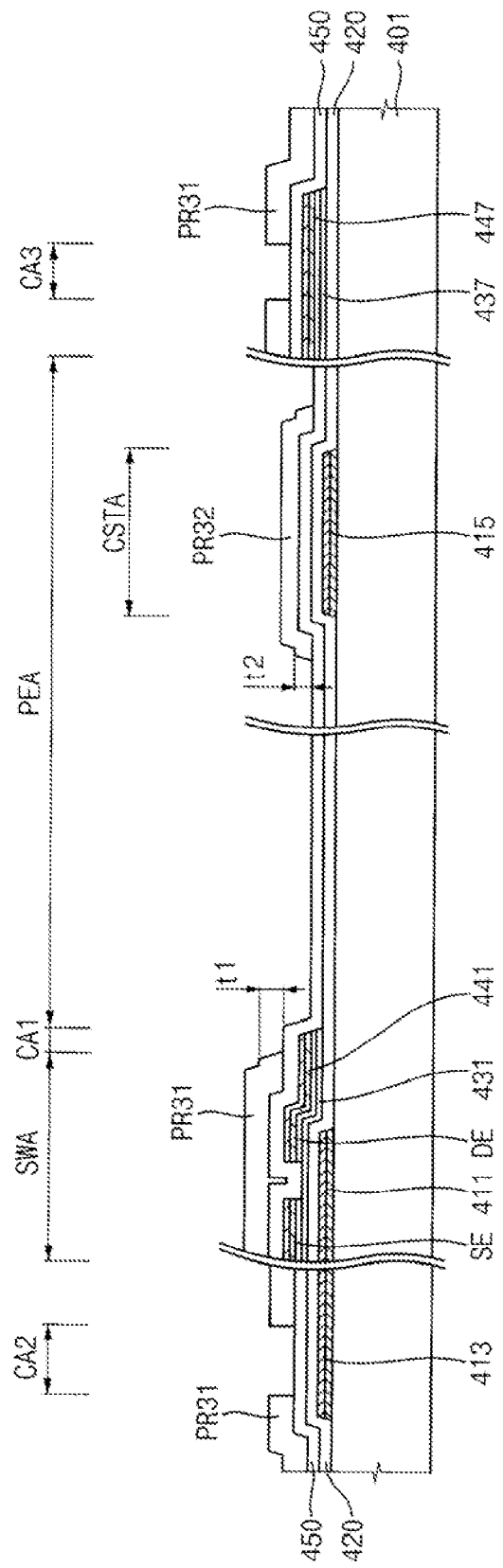

Referring to FIGS. 1 and 5D, a protective insulating layer 450 is formed on the first base substrate 401 having the channel part 431 of the switching element TFT. A third photoresist pattern PR3 is formed on the first base substrate 401 having the protective insulating layer 450 through disposing and patterning the third photoresist film.

The third photoresist pattern PR3 is formed in the switching element area SWA and the storage capacitor area CSTA having the switching element TFT, and in the area of the first base substrate 101 excluding a pixel electrode area PEA, the contact part area CA1, a first contact hole area CA2 and a second contact hole area CA3.

Particularly, the first pattern PR31 is formed to a first thickness T1 in the area defined by the switching element area SWA and the conductors DLm, DLm+1, GLn−1 and GLn, and the second pattern PR32 is formed to a second thickness T2 in the storage capacitor area CSTA. When the third photoresist film is positive, the second pattern PR32 is patterned through the slit mask or the half-tone mask and formed to the second thickness. The second thickness T2 is smaller than the first thickness T1.

Referring to FIGS. 1 and 5E, the gate insulating layer 420 and the protective insulating layer 450 of the pixel electrode area PEA, a contact part area CA1, the first contact hole area CA2 and the second contact hole area CA3 are removed through the first etching process using the third photoresist patterns PR31 and PR32. A dry etching process may be preferable in the first etching process.

Thus, a first protective insulation pattern 451 is formed on a first gate insulation pattern 421 and the source and the drain electrode SE and DE over a gate electrode 411. The first end area of drain electrode DE on the contact part area CA1 is exposed, and a first contact hole 473 is formed in the first contact hole area CA2, and a second contact hole 477 is formed in the second contact hole area CA3. The first and the second contact holes 473 and 477 may be a plurality.

The first end area of drain electrode DE is exposed by the first etching process, and the gate end area pattern 411 is exposed by the first contact part 473, and the source end area pattern 447 is exposed by the second contact hole 477.

In addition, the gate insulation pattern 425 and the protective insulation pattern 455 are formed on the storage common electrode 415 in the storage capacitor area CSTA.

The third photoresist patterns PR31 and PR32 are etched by a predetermined thickness through the etch-back process.

Referring to FIGS. 1 and 5F, the second pattern PR32 formed in the storage capacitor area CSTA is removed by the etch-back process, and the third pattern PR33 remains at a third thickness T3 in the conductor area having the switching element area SWA and the conductors DLm, DLm+1, GLn−1 and GLn.

The exposed end area of drain electrode DE, the gate end area pattern 411 exposed by the first contact part 473, and the source end area pattern 477 exposed by the second contact hole are removed in the second etching process using the third pattern PR33. Thereby the first side area SC1 is formed on the end area of drain electrode DE, and the second side area SC2 is formed on the gate end area 413, and the third side area SC3 is formed on the source end area pattern 447. In addition, the second insulator pattern 455 in the storage capacitor area CSTA is removed, and only the second gate insulator pattern 425 remains on the storage common electrode 415.

A dry etching process may be preferable in the second etching process. The mixture of chloride gas and fluoride gas is used to prevent the aluminum of the upper layer of the first, the second and the third side areas SC1, SC2 and SC3 from corroding in the second etching process. The fluoride ions substitute for the chloride ions on the surface of the first, the second and the third side areas SC1, SC2 and SC3, so that the corrosion caused by the residual chloride ions may be prevented.

As another method to prevent corrosion, when molybdenum in the lower layer is etched through the second etching with fluoride gas after the first etching of the aluminum with chloride gas, the residual chloride ions on the first base substrate 101 may be removed by the fluoride gas.

Figure 5G:
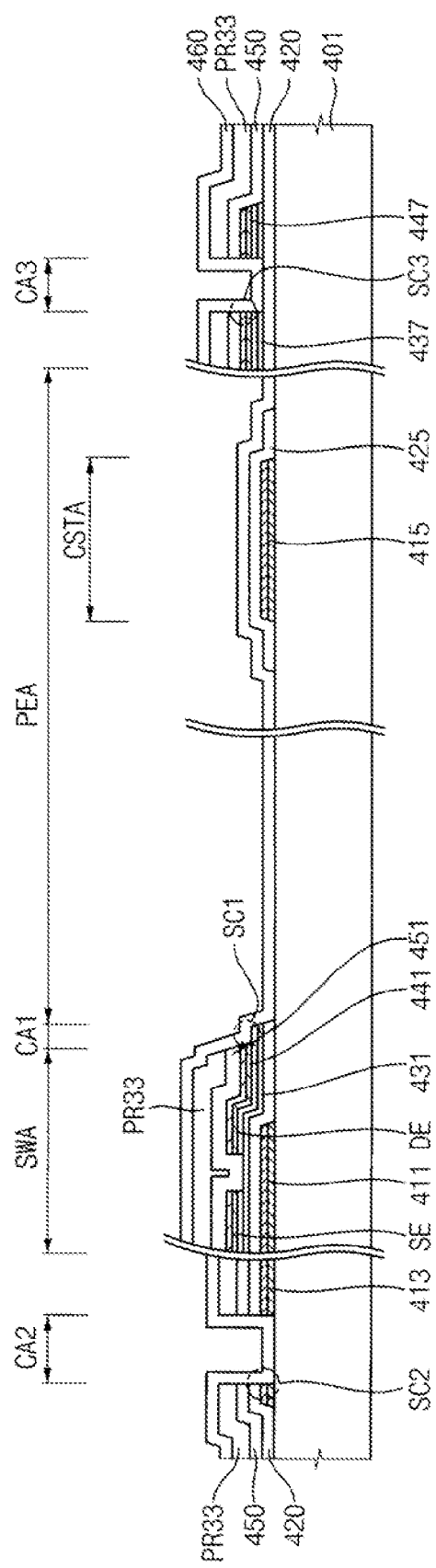

Referring to FIGS. 1 and 5G, the transparent conductive layer 460 is formed on the first base substrate 101 having the first, the second and the third side areas SC1, SC2 and SC3.

The transparent conductive layer 460 is electrically connected to the first side area CS1 of drain electrode DE, the second side area SC2 of the gate end area pattern 413 and the third side area SC3 of the source end area pattern 447.

The third photoresist pattern PR3 is then removed through a stripping process.

Figure 5H:
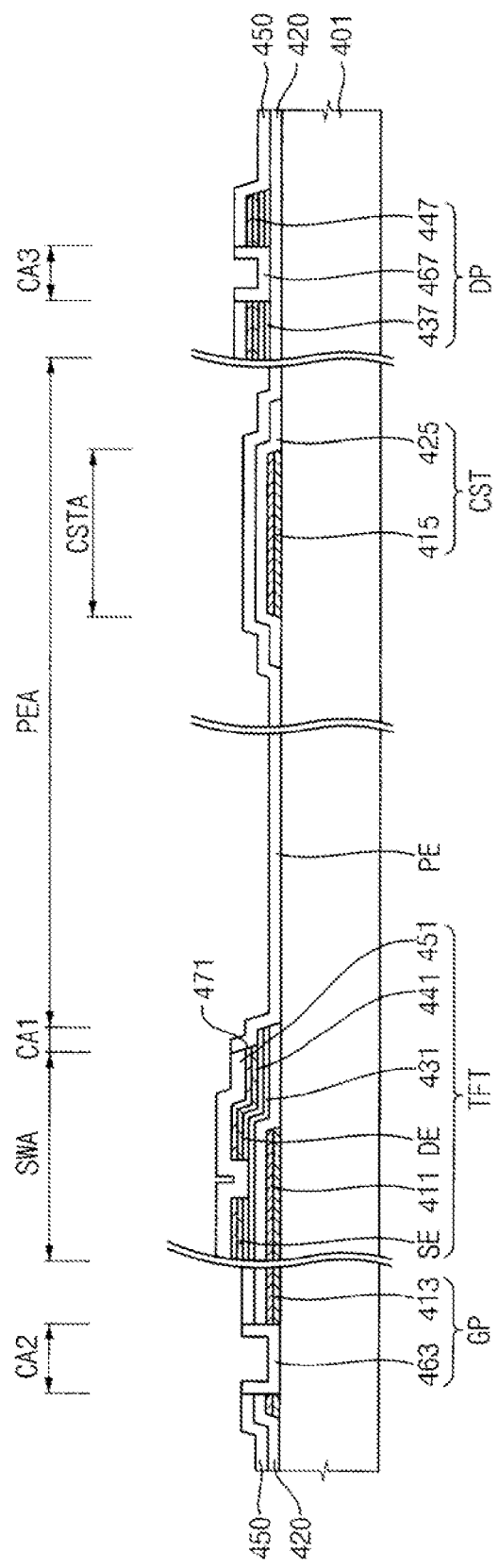

Referring to FIGS. 1 and 5H, the transparent conductive layer 460 is patterned through the stripping process of the third photoresist pattern. Pixel electrode PE, the gate pad pattern 463 and the source pad pattern 467 are formed.

Particularly, drain electrode DE is electrically connected to pixel electrode PE through the contact part 471. The contact part 471 connects the first side area SC1 of drain electrode DE to pixel electrode PE. Gate pad GP is formed on the gate pad pattern 463 electrically connected to the second side area SC2 of the gate end area pattern 413 through the first contact hole 473. The source pad DP is formed on the source pad pattern 467 electrically connected to the third side area SC3 of the source end area pattern 447 through the second contact hole 477.

Moreover, the storage capacitor CST is defined by pixel electrode PE and the storage common electrode 415.

According to the present invention, when each of the gate metallic layer and the source metallic layer has the double-layer structure (Mo/Al) that includes the lower layer of molybdenum (Mo) or a molybdenum alloy and the upper layer of aluminum (Al) or an aluminum alloy, the resistance of the metallic layer is decreased and the corrosion of the aluminum is prevented, thereby improving the contact characteristics of the metallic layer.

Particularly, when a metallic conductor has a triple-layer structure of molybdenum/aluminum/molybdenum (Mo/Al/Mo) layers or the double-layer structure of aluminum/molybdenum (Al/Mo) layers, the aluminum layer is formed on the molybdenum layer. When the aluminum layer is formed on the molybdenum layer, fluoride ions of an etching gas react with molybdenum ions of the molybdenum layer, so that the fluoride ions function as a gatherer. Thus, the fluoride ions are attached to the photoresist pattern and the lower aluminum layer so that chlorine ions may not be substituted or removed.

According to the present invention, however, the corrosion of aluminum in the low-resistance metallic conductor having the upper aluminum layer is avoided in the etching process by using a mixture gas including a chloride gas and a fluoride gas without the gatherer (i.e., fluoride ions). Thus, the corrosion of the conductor is prevented.

Although the exemplary embodiments of the present invention have been described, it is understood that various changes and modifications can be made by those of ordinary skill in the art without, however, departing from spirit and scope of the invention.

What is claimed is:

1. A display substrate comprising:
   a plurality of gate conductors extended in a first direction;
   a plurality of source conductors extended in a second direction crossing the first direction, each of the source conductors including a first lower layer of molybdenum or a molybdenum alloy and a first upper layer of aluminum or an aluminum alloy;
   a plurality of pixel areas defined by the gate conductors and the source conductors;
   a switching element formed in each pixel area, the switching element including a gate electrode extended from one of the gate conductors and a source electrode extended from one of the source conductors; and
   a pixel electrode electrically connected to a drain electrode of the switching element, the pixel electrode including a transparent conductive material.

2. The display substrate of claim 1, wherein the lower layer is formed to a thickness between about 500 Å and about 1,500 Å.

3. The display substrate of claim 1, wherein the pixel electrode is electrically connected to the drain electrode through a side area of the drain electrode.

4. The display substrate of claim 1, further comprising a source pad formed on a first end area of each of the source conductors and receiving a source signal.

5. The display substrate of claim 4, wherein the source pad comprises:
   a source end area pattern extended from the source conductor; and
   a source pad pattern including a transparent conductive material and electrically connected to a side area of the source end area pattern by a first contact hole.

6. The display substrate of claim 1, wherein the gate conductors comprise:
   a second lower layer including molybdenum or a molybdenum alloy; and a second upper layer including aluminum or an aluminum alloy.

7. The display substrate of claim 6, wherein the thickness of the second lower layer is between about 500 Å and about 1,500 Å.

8. The display substrate of claim 6, further comprising a gate pad formed in the first end area of each of the gate conductors to receive the gate signal.

9. The display substrate of claim 8, wherein the gate pad comprises:
   a gate end area pattern extended from each of the gate conductors; and
   a gate pad pattern including a transparent conductive material, and electrically connected to a side area of the gate end area pattern through a second contact hole.

10. The display substrate of claim 6, wherein the pixel area further comprises a storage common electrode including the second lower layer and the second upper layer.

11. The display substrate of claim 9, further comprising a protective insulating layer surrounding a side portion of the gate end area pattern and defining the second contact hole,
    wherein the gate pad pattern contacts with a side area of the protective insulating layer in the second contact hole.

12. The display substrate of claim 1, wherein the pixel area further comprises a storage common electrode, an active layer and an ohmic contact layer which are formed on the storage common electrode.

13. The display substrate of claim 12, wherein the pixel electrode contacts with the active and ohmic layers formed on the storage common electrode.

14. The display substrate of claim 1, further comprising a protective insulating layer formed on the source electrode and the drain electrode, wherein the pixel electrode contacts with a side area of the protective insulating layer formed on the drain electrode.

15. The display substrate of claim 14, the pixel electrode directly contacts with a substrate of the pixel area.

16. The display substrate of claim 5, further comprising a protective insulating layer surrounding a side portion of the source end area pattern and defining the first contact hole,
    wherein the source pad pattern contacts with a side area of the protective insulating layer in the first contact hole.

* * * * *